United States Patent
Kannengiesser et al.

(10) Patent No.: US 10,649,054 B2
(45) Date of Patent: May 12, 2020

(54) SIGNAL-PRESERVING NOISE DECORRELATION

(71) Applicant: Siemens Healthcare GmbH, Erlangen (DE)

(72) Inventors: Stephan Kannengiesser, Wuppertal (DE); Boris Mailhe, Plainsboro, NJ (US)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 16/189,430

(22) Filed: Nov. 13, 2018

(65) Prior Publication Data

US 2019/0146048 A1     May 16, 2019

Related U.S. Application Data

(60) Provisional application No. 62/585,069, filed on Nov. 13, 2017.

(51) Int. Cl.
  *G01R 33/56* (2006.01)
  *G01R 33/3415* (2006.01)
  *G01R 33/561* (2006.01)

(52) U.S. Cl.
  CPC ...... *G01R 33/5608* (2013.01); *G01R 33/3415* (2013.01); *G01R 33/5611* (2013.01)

(58) Field of Classification Search
  CPC .......... G01R 33/5608; G01R 33/5611; G01R 33/3415
  USPC ................................................. 324/309, 322
  See application file for complete search history.

(56) References Cited

U.S. PATENT DOCUMENTS 7,098,659 B2 * 8/2006 Reykowski ............ G01R 33/54
                                                           324/309

OTHER PUBLICATIONS

Pruessmann,. et al. "Sense: Sensitivity Encoding for Fast MRI" Magnetic Resonance in Medicine; vol. 42; No. 5; pp. 952-962, (1999).
Pruessmann,. et al. "Advances in Sensitivity Encoding With Arbitrary k-Space Trajectories" Magnetic Resonance in Medicine, vol. 46, No. 4, pp. 638-651, (2001).
Hansen. et al. "Image reconstruction: an overview for clinicians" Journal of Magnetic Resonance Imaging, vol. 41, No. 3, pp. 573-585; (2015).
Wikipedia; "Whitening transformation".
Kessy, et al. "Optimal Whitening and Decorrelation" arXiv:1512.00809; pp. 1-14; Dec. 2, 2015; last revision Dec. 17, 2016.
Kellman, et al. "Image reconstruction in SNR units: a general method for SNR measurement" Magnetic Resonance in Medicine, vol. 54, pp. 1439-1447, (2005).

* cited by examiner

*Primary Examiner* — Farhana A Hoque
(74) *Attorney, Agent, or Firm* — Schiff Hardin LLP

(57) ABSTRACT

In a method and apparatus for noise decorrelation of magnetic resonance (MR) measurement signals acquired by multiple detectors of an MR apparatus, which are disturbed by additive noise, noise signals and reference signals of the multiple detectors are used to determine an improved noise decorrelation matrix, which removes a noise correlation in the MR measurement signals of the multiple detectors.

12 Claims, 3 Drawing Sheets

SIGNAL-PRESERVING NOISE DECORRELATION

RELATED APPLICATION

The present application claims the benefit of the filing date of Provisional Application Control No. 62/585,069, filed on Nov. 13, 2017, the contents of which are incorporated herein by reference.

BACKGROUND OF THE INVENTION

Field of the Invention

The present invention concerns noise decorrelation and in particular to a method for noise decorrelation of magnetic resonance (MR) measurement signals acquired by multiple detectors of an MR system. The present invention also concerns a computer, an MR apparatus, and a non-transitory, computer-readable data storage medium encoded with programming instructions that implement such a method.

Description of the Prior Art

Noise decorrelation of MR measurement signals detected or received in multiple MR measurement channels is also referred to as noise whitening transformation. As a preprocessing step, it is necessary for optimal performance of subsequent signal processing, e.g. iPAT or channel combination. Further, since noise decorrelation allows quantitative noise characterization, it is also the base for advanced signal processing algorithms such as signal-to-noise (SNR) quantification. Noise decorrelation is a well-known concept to those skilled in the art, which in the context of MR image reconstruction is described in "Advances in Sensitivity Encoding With Arbitrary k-Space Trajectories" by Klaas P. Pruessmann et al., Magnetic Resonance in Medicine 46:638-651 (2001) and "SENSE: Sensitivity Encoding for Fast MRI" by Klaas P. Pruessmann et al., Magnetic Resonance in Medicine 42:952-962 (1999). For the technical background, further reference is made to "Image reconstruction: an overview for clinicians", by Michael S. Hansen and Peter Kellman, J Magn Reson Imaging, 2015 March 41(3): 573-585.

Measuring the noise covariance matrix Cov(n) for a number of measurement channels is routinely done by acquiring MR data n without a preceding radio-frequency (RF) excitation. In subsequent scans, which have a non-zero MR signal, the noise is in very good agreement with the previously acquired noise signals, which may be additive, white, and Gaussian-distributed. While the effect of noise decorrelation on quadratic forms is unique, i.e. it has a unit noise covariance matrix, the noise decorrelation matrix for a set of MR reception channels is not unique. For example, in Matlab notation, both A1=sqrtm(inv(Cov(n))) and A2=inv(chol(Cov(n))) decorrelate the noise, i.e., Cov (A1*n)= Cov(A2*n)=Id, where Id is the unit matrix.

In "Optimal whitening and decorrelation", by Kessy et al. arXiv:1512.00809, a noise decorrelation method is described, which minimizes the effect of whitening on a single noise vector by looking at the cross-covariance of the original and decorrelated signal, not taking into account the case when the noise is an addition to a common signal in multiple detector channels.

In general, any rotation, i.e. a multiplication by an orthogonal operator, of a noise decorrelation matrix is again a noise decorrelation matrix. According to current techniques for noise decorrelation for MR measurement signals, a noise decorrelation matrix is chosen arbitrarily. If in doubt, e.g. when MR imaging includes particular channels, for which decorrelated MR signals need a particular property, such as e.g. a similarity to the original physical channel, noise decorrelation is not performed. Undesirable properties of the decorrelated channels' coil sensitivities have to be compensated for by dedicated processing steps like prescan-based phase correction. Further, a drawback of picking the noise decorrelation matrix arbitrarily is that the sensitivities of the decorrelated channels may look very different from the original channels. Additionally, the decorrelated channels may have other undesirable properties, such as sensitivity distributions with a strongly varying phase.

SUMMARY OF THE INVENTION

Accordingly, there is a need for an improved method for noise decorrelation of MR measurement signals, which overcomes the above-mentioned disadvantages. It is, therefore, an objective of the present application to provide a method, an MR apparatus, and a non-transitory, computer-readable data storage medium, which provide an improved noise decorrelation of MR measurement signals from multiple MR detector channels.

According to a first aspect of the invention, a method is provided for noise decorrelation of MR measurement signals acquired by multiple detectors from an examination region of a MR system, which are disturbed by additive noise. In a first step, the MR scanner is operated so that respective MR measurement signals, noise signals and reference signals from the examination region of the MR scanner are acquired (detector) by each of the multiple antennas. In further step, a noise decorrelation matrix, which removes a correlation in the noise signals of the multiple detectors, is determined using the noise signals and the reference signals. Noise decorrelation of the MR measurement signals is then performed in the computer using the determined noise decorrelation matrix. The MR measurement signals in which the noise decorrelation has been performed are made available from the computer in electronic form, as a data file, for further processing, such as for image reconstruction using an image reconstruction algorithm that involves a physical property of the respective antennas represented in the respective reference signal detected thereby.

Thereby, an improved method for noise decorrelation of MR measurement signals is provided, which provides noise-decorrelated channels with similar properties as the original, physical channels. In particular, sensitivities of the decorrelated channels are similar to the original channels, wherein sensitivity distributions have similar phases. For example, such decorrelated MR measurement signals of an individual detector (antenna) channel can still be associated to a specific spatial region of the examination region. This enables noise decorrelation for previously impossible cases such as "mode matrix" systems, as described in U.S. Pat. No. 7,098,659 B2, and pre-compressed channel sets. Other unfavorable properties of the sensitivities of decorrelated channels may be minimized simultaneously.

Accordingly, the method enables better MR image quality and shorter MR measurement and image reconstruction times compared to current methods for noise decorrelation of MR measurement signals. In particular, noise decorrelation of particular channels, e.g. the "CP" or "primary" modes of an original TIM system by Siemens Healthcare AG, can be performed, with the properties of the individual coil sensitivities of the decorrelated channels being initially unchanged.

According to a second aspect of the invention, a computer is provided, which is configured for noise decorrelation of MR measurement signals acquired by multiple detectors from an examination region of a MR apparatus, The computer has a memory and at least one processor, the memory containing instructions to be executed by the at least one processor, wherein execution of the instructions causes the computer to execute the steps of the method according to any one or any combination of the methods described above in the first aspect of the invention.

According to a third aspect of the invention, an MR apparatus is provided, which is configured for noise decorrelation of MR measurement signals acquired by multiple detectors from an examination region of the MR system. The MR apparatus has a computer having a memory and at least one processor, the memory containing instructions to be executed by said at least one processor, wherein execution of the instructions by the at least one processor causes the MR apparatus to execute the steps of the method according to any one or any combination of the methods described above in the first aspect of the invention. The MR apparatus includes an MR data acquisition scanner, such as a medical MR imaging scanner.

The present invention also encompasses a non-transitory, computer-readable data storage medium encoded with programming instructions, the storage medium being loaded into a computer or a computer system of an MR apparatus and the programming instructions causing the computer or computer system to operate the MR apparatus so as to implement any or all embodiments of the method according to the invention, as described above.

Although specific features described in the above summary and the following detailed description are described in connection with specific embodiments and aspects of the present invention, it should be understood that the features of the exemplary embodiments and aspects may be combined with each other, and correlate to each other, unless specifically noted otherwise.

Therefore, the above summary is merely intended to give a short overview over some features of some embodiments and implementations and is not to be construed as limiting. Other embodiments may comprise other features than the ones explained above.

DESCRIPTION OF THE PREFERRED EMBODIMENTS

Figure 1:
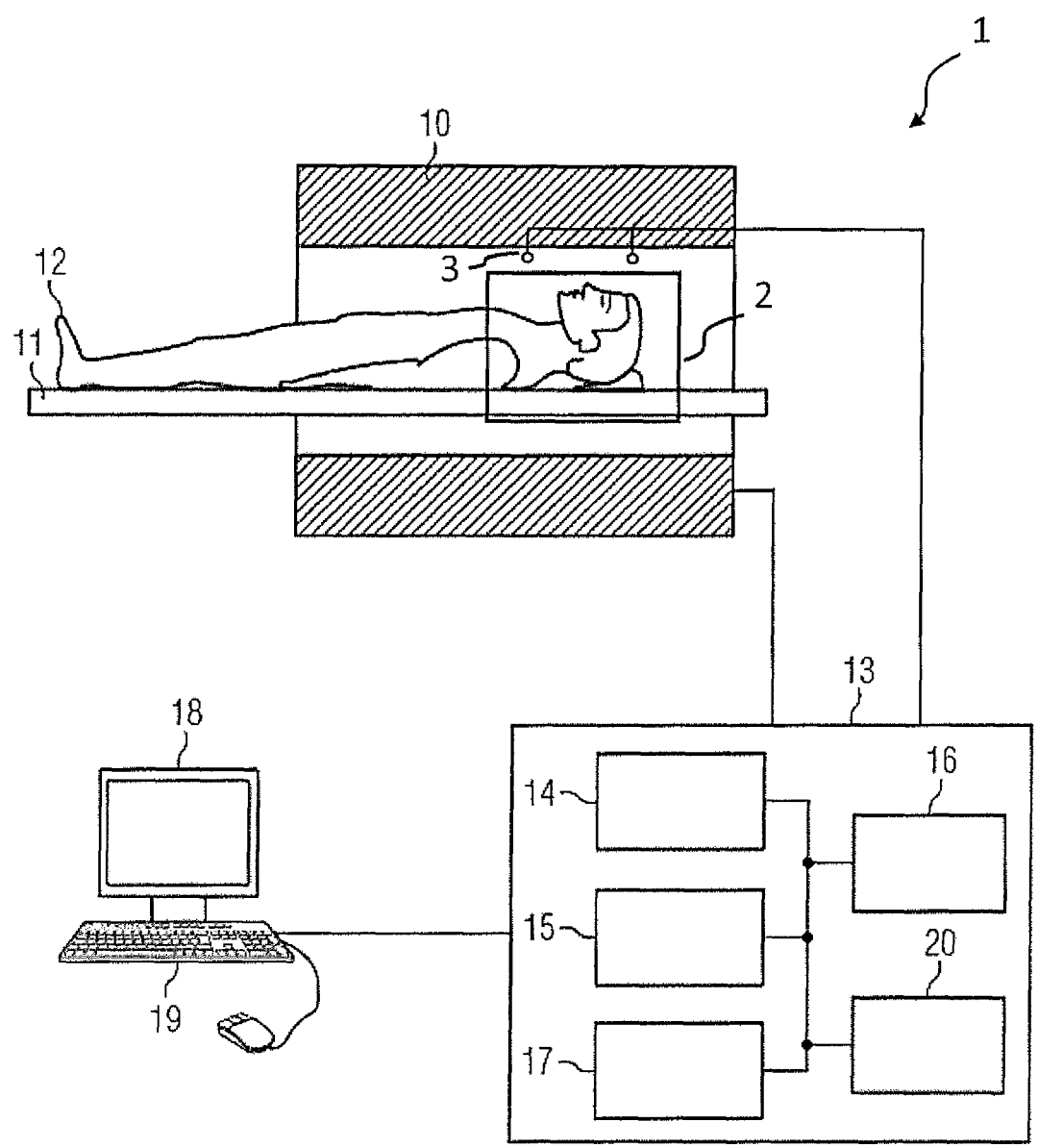
FIG. 1 schematically illustrates an MR apparatus for noise decorrelation of MR measurement signals, according to the invention.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, modules or other physical or functional units shown in the drawings or described herein may also be implemented by an direct or indirect, connection or coupling. A coupling between components may be established wired or over a wireless connection. Functional blocks, computing devices, nodes or entities may be implemented in hardware, firmware, software, or a combination thereof.

Hereinafter, various techniques with respect to employing a method for noise decorrelation of MR measurement signals are described.

FIG. 1 schematically illustrates an MR apparatus 1 for noise decorrelation of MR measurement signals 4, according to embodiments of the invention.

As shown in FIG. 1, the MR apparatus 1 has a scanner 10 in which an examination object 12, such as a patient is situated in an examination tunnel so as to be within an examination region 2 of the scanner 10. The scanner 10 has a basic field magnet that generates a basic field B0. The examination object 12 is moved in the center of the scanner 10 into the examination region 2, such that the scanner 10 receives spatially coded magnetic resonance signals from the examination region 2 with multiple antennas 3. Each antenna 3 has a corresponding measurement channel. By radiation of RF pulse sequences and switching of magnetic field gradients, certain nuclear spins in the examination object 12 in the region 2 are deflected from the equilibrium position established by the basic field 130. While returning to the equilibrium position, the spins emit magnetic resonance signals that are received by the antennas 3. The MR measurement signals 4 detected by each antenna 3 are associated with a corresponding MR measurement channel. These MR measurement signals can be disturbed by additive noise, which is noise intrinsic to the MR apparatus 1. The general manner of operation of the MR apparatus 1 for the generation of MR images and the detection of the magnetic resonance signals are known to those skilled in the art, so that a more detailed explanation is not necessary herein.

The MR apparatus 1 has an MR controller 13, which controls the overall MR apparatus 1. The central MR controller 13, which is configured to perform the method described below for noise decorrelation of MR measurement signals, further has a gradient controller 14 for controlling and switching the magnetic field gradients, and an RF controller 15 for controlling and irradiating the RF pulses in order to deflect the nuclear spins from the equilibrium position. In a memory 16, the imaging sequences necessary for recording the MR images can be stored, as well as the programs that are necessary for the operation of the MR apparatus 1. A recording processor 17 controls the image recording and thus controls the sequence of the magnetic field gradients and RF pulses and the reception intervals of MR measurement signals according to the determined imaging sequences. The recording processor 17 also controls the gradient controller 14 and the RF controller 15. MR images, which can be displayed on a display 18, are reconstructed from the acquired raw data in a processor 20. An operator operates the MR apparatus 1 via an input unit 19. The memory 16 can have imaging sequences and program modules, which carry out the method according to the invention for noise decorrelation of MR measurement signals when executed in the processor 20 of one of the modules. The RF controller 15 may further be configured to improve the method for noise decorrelation of MR measurement signals, as is explained in the following in detail. In particular, the memory 16 stores control information, which can be derived from the MR controller 13. Further, the recording processor 17 is configured to perform the following method for noise decorrelation of MR measurement signals.

The MR apparatus of FIG. 1 is designed such that, during the execution of the control information in the MR controller 13, the method for noise deem-relation of MR measurement signals according to embodiments of the invention is performed.

Figure 2:
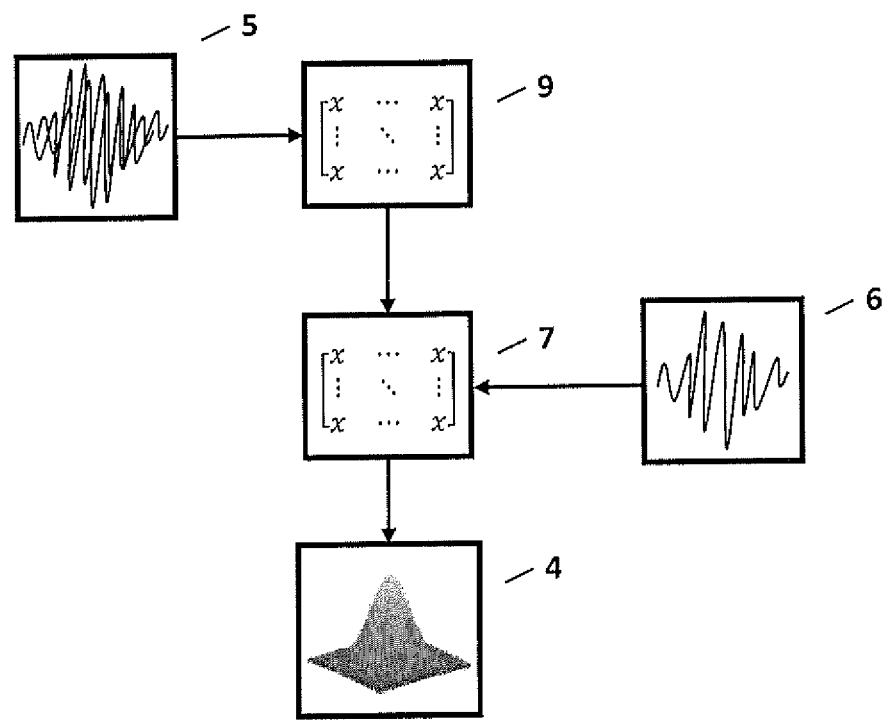
FIG. 2 schematically illustrates a method for noise decorrelation of MR measurement signals, according to embodiments of the invention.

FIG. 2 schematically illustrates the method for noise decorrelation of MR measurement signals 4, according to embodiments of the invention.

In the following, the improved method for noise decorrelation of MR measurement signals 4 of the multiple MR detector channels using an optimized noise correlation matrix 7 based on noise signals 5 and reference signals 6 according to the invention is described in further detail.

Information about the individual channels is easily measurable and routinely done in conventional MR systems. For this purpose, both noise and MR signal data are measured in an adjustment procedure before the MR imaging process, the former for a conventional noise decorrelation calculation, the latter, for example, for a coil sensitivity calculation in order to then reconstruct image data from the acquired MR signals (raw data). According to the present invention, the above-mentioned measured noise data, also referred to as noise signals 5, and the above-mentioned measured sensitivity adjustment data, also referred to as reference signals 6, are used to calculate an optimized noise decorrelation matrix 7, which minimizes the effects on the non-noise MR measurement signals 4 after noise decorrelation.

In general, any rotation, i.e. a multiplication by an orthogonal operator, of a noise decorrelation matrix is again a noise decorrelation matrix. Therefore, a joint calculation of an optimized noise decorrelation matrix according to the invention uses an adjustment noise signal X [CxNx], where C is the number of channels of the receive coil array and Nx is the number of noise measurements acquired, and a reference signal Y [CxNy] as described in the following.

Therein, let A be a known whitening operator with respect to the noise signal X, i.e. $E(AXX^H A^H)=Id$.

Then, multiplying A by any orthogonal operator to the left preserves the whitening of the noise signal X. Therefore, the goal is to find the operator $\hat{W}$ that minimizes distortion of the measurements:

$$\hat{W} = \arg\min_{\hat{W} \in O(C)} \|WAY - Y\|_F^2$$

According to an embodiment of the invention, this can be solved by the following steps:

$$\|WAY - Y\|_F^2 = \|WAY\|_F^2 - 2Re\langle WAY \mid Y\rangle + \|Y\|_F^2$$
$$= \|AY\|_F^2 - 2Re\langle W \mid YY^H A^H\rangle + \|Y\|_F^2$$

Because $\hat{W}$ is orthogonal, the following relation applies:

$$\hat{W} = \arg\max_{\hat{W} \in O(C)} Re\langle W \mid YY^H A^H\rangle$$

Using a Singular Value Decomposition (SVD) $YY^H A^H \triangleq U\Delta V^H$, the operator $\hat{W}$ can be derived as follows:

$$\hat{W} = \arg\max_{\hat{W} \in O(C)} Re\langle U^H WV \mid \Delta\rangle$$
$$= U\left[\arg\max_{N \in O(C)} Re\langle N \mid \Delta\rangle\right]V^H$$

The sub-problem for N consists in finding the orthogonal operator with maximal correlation to a positive diagonal operator. Its solution is N=Identity. Further, with a change of variable the following relation can be formulated:

$$\hat{W}=UV^H$$

As can be seen from the above example embodiment, in particular a minimization process or maximization process can be used for determining the matrix $\hat{W}$, which is then used to calculate a modified noise decorrelation matrix $\hat{A}=\hat{W}A$.

When special channels like the CP channels of a mode matrix system are used, these channels can be weighted in the above optimization procedure to preserve them particularly well. As adjustment signal one can use any signal which exhibits suitable properties, including the noise signal 5 itself, subsets, and similar signals.

Figure 3:
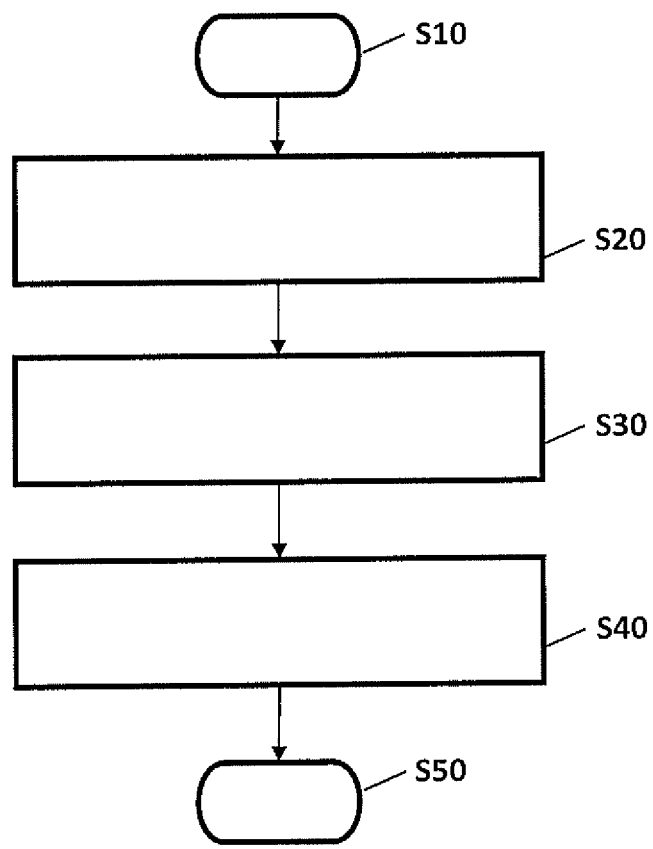
FIG. 3 is a flowchart with steps for performing a method for noise decorrelation of MR measurement signals, according to embodiments of the invention.

FIG. 3 schematically illustrates a flow chart with steps for performing a method for noise decorrelation of MR measurement signals 4, according to embodiments of the invention.

The method starts in step S10. In step S20, a noise signal 5 and a reference signal 6 for each detector 3 are provided. In step S30, a noise decorrelation matrix 7, which removes a correlation in the noise signals 5 of the multiple detectors 3, is determined using the noise signals 5 and the reference signals 6. In step S40, a noise decorrelation of the MR measurement signals is performed using the determined decorrelation matrix. The method ends in step S50.

From the above, some general conclusions can be drawn:

The noise decorrelation matrix can be determined by an optimization process using the reference signals. By using an optimization process based on the reference signals, a decorrelation matrix can be determined, which removes the noise correlation from MR measurement signals and at the same time does not have influence, or minimum influence, on the relevant MR measurement signals of each detector channel.

Determining the noise decorrelation matrix can further comprise calculating an initial noise decorrelation matrix using the noise signals, and transforming the initial noise decorrelation matrix in order to generate the determined noise decorrelation matrix, wherein transforming the decorrelation matrix can be performed using the reference signals. In particular, after noise-decorrelation of the reference signals by the determined noise decorrelation matrix, the noise-decorrelated reference signals can have a predetermined property. By transforming the initial noise decorrelation matrix, a particular advantageous property, which is required from noise-decorrelated MR measurement signals, can be provided, wherein the determined noise decorrelation matrix can be determined in a fast and efficient way based on the initial noise decorrelation matrix.

The initial noise decorrelation matrix can be transformed into the determined noise decorrelation matrix by rotating the initial noise decorrelation using an orthogonal operator $\hat{W}$, wherein operating an arbitrary orthogonal operator $\hat{W}$ on the left side of the noise decorrelation matrix results in another noise decorrelating matrix, and therefore a simple mathematical operation is provided to find an optimized noise decorrelation matrix.

The orthogonal operator $\hat{W}$ can determined by the relation $$\hat{W} = \arg\min_{\hat{W} \in O(C)} \|WAY - Y\|_F^2,$$

wherein A is the initial noise decorrelation matrix, Y represents the reference signals, and $C = X^*X'$. Thereby, the operator is determined using an optimization method, in particular a minimization method, which can be performed easily and efficiently by standard numerical procedures on a computer, wherein the resulting operator $\hat{W}$ is suitable to provide an optimized noise decorrelation matrix, when applied to the initial noise decorrelation matrix A.

Providing a noise signal for each detector can comprise acquiring a MR measurement signal from the examination region of the examination object 12, wherein the magnetization within the examination region is not previously excited by a preceding RF magnetization excitation pulse, and wherein providing a reference signal for each detector comprises acquiring MR imaging measurement data from the examination region. The reference signals may in one embodiment be spatially encoded, and may in another embodiment be different from the noise signals, either by not being noise, i.e. containing an non-zero MR measurement or imaging signal containing MR data or information characteristic for the examination object 12 in the examination region 2, or a different noise measurement, or a subset of the above. The noise signals and reference signals can be provided or detected in a MR measurement for each channel or for a subset of channels.

By using the above MR data as noise signals, respectively reference signals, MR data for a noise decorrelation matrix optimization can be detected routinely during a MR measurement preparation or setup step, alternatively already detected MR data of another procedure of MR measurement preparation can be used for determining an optimized noise decorrelation matrix. In this fashion, based on an original noise decorrelation matrix, an optimized noise decorrelation matrix can be calculated for different imaging situations, e.g. tailored to the current examination region, volume, slice, etc.

The predetermined property can be preserving the reference signals after noise decorrelation with the determined noise decorrelation matrix. Preserving the reference signals can mean that the norm of the difference between the each reference signal and the respective noise-decorrelated reference signal is minimized. Using the norm of the difference between the each reference signal and the respective noise-decorrelated reference signal for minimization provides a fast and efficient mathematical method for determining an improved noise decorrelation matrix.

The reference signals belong to the group consisting of the noise signals, MR imaging signals including a predetermined contrast or resolution, and a subset of the noise signals or the MR imaging signals, thereby the amount of MR data, which is necessary for the noise decorrelation matrix optimization is reduced, which results in shorter MR measurement time.

The reference signals can be used in the signal domain, or in a transformed domain, preferentially in image regions after a Fourier transformation, or in a combination of the above, in particular the noise signals and the reference signals 6 can be provided in a coil sensitivity adjustment procedure, such that data available from other MR measurements can advantageously be used for an improved noise decorrelation.

Summarizing, a method for noise decorrelation of MR measurement signals acquired by multiple detectors from an examination region of a MR system is provided, wherein additive noise on MR measurement channels each belonging to one of the detectors is decorrelated in an improved manner, wherein the relevant properties of MR measurement signals for MR imaging are optimized in the MR measurement channels by choosing an optimized noise decorrelation matrix based on an arbitrary initial decorrelation taking into account noise signals and a reference signal in the MR channels.

The method according to the invention advantageously provides noise-decorrelated channels with similar characteristics as the original physical channels. In particular, the properties of the decorrelated coil sensitivities of the channels are substantially unchanged and decorrelated MR measurement signals of a detector channel can still be associated to a specific spatial region of the examination region. Accordingly, the method provides better MR image quality and faster MR measurement times compared to current methods for noise decorrelation.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for noise decorrelation of magnetic resonance (MR) measurement signals, comprising:

operating an MR data acquisition scanner, while a subject is situated therein, in order to simultaneously individually acquire, in each of a plurality of reception channels that each has a respective reception antenna, a reference signal representing a physical property of the respective antenna, and an MR measurement signal from a sub-region in a region of the subject, each MR measurement signal being disturbed by additive noise that is represented as a noise signal in the respective reception antenna, with the sub-region from which the respective MR measurement signals originate being defined by said physical property of the respective antenna that receives the respective MR measurement signal, and the respective noise signals of the respective reception channels exhibiting a correlation among all of the respective noise signals, which produces a correlation among the respective reference signals;

providing the noise signals and the reference signals to a computer and, in said computer, using the noise signals and the reference signals to produce a decorrelation matrix that removes said correlation among said reference signals while preserving respective associations of the respective antennas with the respective sub-regions of the subject;

also providing said computer with said MR measurement signals and, in said computer, applying said noise decorrelation matrix to the respective MR measurement signals so as to produce noise-decorrelated MR measurement signals that retain said association with the respective sub-regions of the subject; and in said computer, executing a reconstruction algorithm that uses said physical property in order to reconstruct image data from the respective noise-decorrelated MR measurement signals and to combine the image data so as to produce combined image data depicting said region of the subject, and making the combined image data available in electronic form as a data file from said computer.

2. A method as claimed in claim 1 wherein each of said reception antennas has a coil sensitivity, and comprising detecting the respective reference signals in the respective reception channels as reference signals that represent the coil sensitivity of the respective reception antenna and the respective reception channel.

3. A method as claimed in claim 2 comprising acquiring said reference signals by operating said MR data acquisition scanner in a calibration procedure that proceeds acquisition of said MR measurement signals from the subject.

4. A method as claimed in claim 1 comprising, in said computer, producing said noise decorrelation matrix by executing an optimization algorithm using said reference signals.

5. A method as claimed in claim 1 comprising, in said computer, producing said noise correlation matrix by:
calculating an initial noise correlation matrix using said noise signals; and
using said reference signals to transform said initial noise decorrelation matrix into said noise decorrelation matrix.

6. A method as claimed in claim 5 comprising transforming said initial noise correlation matrix into said noise correlation matrix by rotating the initial noise decorrelation matrix using an orthogonal operator $\hat{W}$.

7. A method as claimed in claim 6 wherein said orthogonal operator $\hat{W}$ is $$\hat{W} = \arg\min_{\hat{W} \in O(C)} \|WAY - Y\|_F^2,$$

wherein A is the initial noise decorrelation matrix, Y represents the reference signals, and C is the number of said reception channels.

8. A method as claimed in claim 1 comprising operating said MR data acquisition scanner to obtain said noise signals by acquiring the respective MR measurement signals from the examination region without radio-frequency excitation of nuclear spins in the region, and acquiring said reference signal for each of said reception channels by acquiring spatially encoded MR measurement data from said examination region.

9. A method as claimed in claim 1 comprising preserving said association by, in said computer, minimizing a norm of a difference between each reference signal and a respective noise-decorrelated reference signals.

10. A noise decorrelation computer configured to:
operating an MR data acquisition scanner, while a subject is situated therein, in order to simultaneously individually acquire, in each of a plurality of reception channels that each has a respective reception antenna, a reference signal representing a physical property of the respective antenna, and an MR measurement signal from a sub-region in a region of the subject, each MR measurement signal being disturbed by additive noise that is represented as a noise signal in the respective reception antenna, with the sub-region from which the respective MR measurement signals originate being defined by said physical property of the respective antenna that receives the respective MR measurement signal, and the respective noise signals of the respective reception channels exhibiting a correlation among all of the respective noise signals, which produces a correlation among the respective reference signals;
use the noise signals and the reference signals to produce a decorrelation matrix that removes said correlation among said reference signals while preserving respective associations of the respective antennas with the respective sub-regions of the subject;
apply said noise decorrelation matrix to the respective MR measurement signals so as to produce noise-decorrelated MR measurement signals that retain said association with the respective sub-regions of the subject; and
execute a reconstruction algorithm that uses said physical property in order to reconstruct image data from the respective noise-decorrelated MR measurement signals and to combine the image data so as to produce combined image data depicting said region of the subject, and make the combined image data available in electronic form as a data file from said computer.

11. A magnetic resonance (MR) apparatus comprising:
an MR data acquisition scanner comprising a plurality of reception channels, each having a respective reception antenna;
a computer configured to operate said MR data acquisition scanner, while a subject is situated therein, in order to simultaneously individually acquire, in each of said plurality of reception channels with respective reception antenna thereof, a reference signal representing a physical property of the respective antenna, and an MR measurement signal from a sub-region in a region of the subject, each MR measurement signal being disturbed by additive noise that is represented as a noise signal in the respective reception antenna, with the sub-region from which the respective MR measurement signals originate being defined by said physical property of the respective antenna that receives the respective MR measurement signal, and the respective noise signals of the respective reception channels exhibiting a correlation among all of the respective noise signals, which produces a correlation among the respective reference signals;
said computer being configured to use the noise signals and the reference signals to produce a decorrelation matrix that removes said correlation among said reference signals while preserving respective associations of the respective antennas with the respective sub-regions of the subject;
said computer being configured to apply said noise decorrelation matrix to the respective MR measurement signals so as to produce noise-decorrelated MR measurement signals that retain said association with the respective sub-regions of the subject; and
said computer being configured to execute a reconstruction algorithm that uses said physical property in order to reconstruct image data from the respective noise-decorrelated MR measurement signals and to combine the image data so as to produce combined image data depicting said region of the subject, and to make the combined image data available in electronic form as a data file from said computer.

12. A non-transitory, computer-readable data storage medium encoded with programming instructions, said storage medium being loaded into a computer of a magnetic resonance (MR) apparatus that comprises an MR data acquisition scanner, said programming instructions causing said computer system to:

operate an MR data acquisition scanner, while a subject is situated therein, in order to simultaneously individually acquire, in each of a plurality of reception channels that each has a respective reception antenna, a reference signal representing a physical property of the respective antenna, and an MR measurement signal from a sub-region in a region of the subject, each MR measurement signal being disturbed by additive noise that is represented as a noise signal in the respective reception antenna, with the sub-region from which the respective MR measurement signals originate being defined by said physical property of the respective antenna that receives the respective MR measurement signal, and the respective noise signals of the respective reception channels exhibiting a correlation among all of the respective noise signals, which produces a correlation among the respective reference signals;

use the noise signals and the reference signals to produce a decorrelation matrix that removes said correlation among said reference signals while preserving respective associations of the respective antennas with the respective sub-regions of the subject;

apply said noise decorrelation matrix to the respective MR measurement signals so as to produce noise-decorrelated MR measurement signals that retain said association with the respective sub-regions of the subject; and execute a reconstruction algorithm that uses said physical property in order to reconstruct image data from the respective noise-decorrelated MR measurement signals and to combine the image data so as to produce combined image data depicting said region of the subject, and make the combined image data available in electronic form as a data file from said computer.

* * * * *